(12) United States Patent
Kaesbauer et al.

(10) Patent No.: US 11,425,835 B2
(45) Date of Patent: Aug. 23, 2022

(54) SWITCHING DEVICE FOR A SINGLE-PHASE OR MULTIPHASE ELECTRICAL CONSUMER

(71) Applicant: Siemens Aktiengesellschaft, Munich (DE)

(72) Inventors: Peter Kaesbauer, Schwandorf (DE); Johannes Engelmann, Amberg (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 330 days.

(21) Appl. No.: 16/802,745

(22) Filed: Feb. 27, 2020

(65) Prior Publication Data

US 2020/0281088 A1 Sep. 3, 2020

(30) Foreign Application Priority Data

Mar. 1, 2019 (EP) .................................... 19160214

(51) Int. Cl.
| | |
|---|---|
| *H01H 9/54* | (2006.01) |
| *H05K 7/14* | (2006.01) |
| *H01H 71/12* | (2006.01) |
| *H03K 17/16* | (2006.01) |
| *H05K 7/20* | (2006.01) |

(52) U.S. Cl.
CPC .......... *H05K 7/1432* (2013.01); *H01H 9/541* (2013.01); *H01H 71/125* (2013.01); *H03K 17/166* (2013.01); *H05K 7/209* (2013.01); *H05K 7/20918* (2013.01)

(58) Field of Classification Search
CPC .... H01H 9/541; H01H 71/125; H05K 7/1432; H05K 7/209; H03K 17/166
See application file for complete search history.

(56) References Cited

U.S. PATENT DOCUMENTS

| | | |
|---|---|---|
| 4,943,890 A | 7/1990 | Schaltenbrand et al. |
| 5,337,214 A | 8/1994 | Lindsey et al. |
| (Continued) | | |

FOREIGN PATENT DOCUMENTS

EP 1037515 A2 9/2000

*Primary Examiner* — Adolf D Berhane
*Assistant Examiner* — Afework S Demisse
(74) *Attorney, Agent, or Firm* — Harness, Dickey & Pierce, P.L.C.

(57) ABSTRACT

A switching device includes a number of line sections corresponding to a number of phases, each including a first and a second connection part, for connection to a connection phase of an electrical consumer. At least one controllable semiconductor switching element is provided per phase, wired between the first and second connection part. A bypass unit includes one controllable electromechanical switching element with a low on-resistance per phase. The controllable electromechanical switching element is wired, in parallel with the controllable semiconductor switching element of this phase, between the first and second connection part. The first and second connection part of a respective phase are arranged adjacently on one side of the power module in spatial proximity in a direction of extent. A contact bridge, assigned to a respective phase, runs in the direction of extent in order to electrically connect the first and second connection part in the switched-on state.

16 Claims, 6 Drawing Sheets

(56) References Cited

U.S. PATENT DOCUMENTS

| | | | | |
|---|---|---|---|---|
| 7,679,886 B2 * | 3/2010 | Meier | ............... | H05K 7/1432 |
| | | | | 361/620 |
| 2008/0137238 A1 * | 6/2008 | Wright | ............... | H01H 9/541 |
| | | | | 361/87 |

\* cited by examiner

SWITCHING DEVICE FOR A SINGLE-PHASE OR MULTIPHASE ELECTRICAL CONSUMER

PRIORITY STATEMENT

The present application hereby claims priority under 35 U.S.C. § 119 to European patent application number EP19160214.3 filed Mar. 1, 2019, the entire contents of which are hereby incorporated herein by reference.

FIELD

Embodiments of the invention generally relates to a switching device for a single-phase or multiphase electrical consumer. At least one embodiment of the switching device comprises a number of line sections corresponding to the number of phases, wherein each line section comprises a first connection part, serving as input, for connection to a grid phase and a second connection part, serving as output, for connection to a phase of the electrical consumer. At least one embodiment of the switching device furthermore comprises a power module and a bypass unit. The power module comprises at least one controllable semiconductor switching element per phase, wherein the at least one controllable semiconductor switching element is wired between the first and the second connection part. The bypass unit comprises one controllable electromechanical switching element with a low on-resistance per phase, wherein the controllable electromechanical switching element is wired, in parallel with the at least one controllable semiconductor switching element of this phase, between the first and the second connection part.

BACKGROUND

Switching devices, for example, are for a soft starter for a working machine, in particular a permanently excited three-phase current machine. The power module is required in order to allow the working machine to start in a controlled manner. The bypass unit serves to keep the power losses as low as possible during operation at the nominal operating point of the working machine. The power losses are minimized by virtue of the fact that the power module, after reaching the nominal operating point, is bypassed by way of the bypass unit and the electromechanical switching elements contained therein. In the case of a soft starter, the bypass unit is also called a "bypass", wherein the controllable electromechanical switching elements are present in the form of contactors or relays. The bypass unit may be arranged together with the power module in a common housing. Soft starters of this kind in which the bypass unit and the power module are present in different housings and are combined at the usage location through corresponding wiring to form the soft starter are also known.

One disadvantage of such a switching device is that it is not possible to achieve a compact structure, that is to say with small outer dimensions, due to the use of pre-manufactured subcomponents. This is exacerbated by the fact that, in particular when the bypass unit and the power module are present in different housings, these have to be electrically connected to one another with a great deal of effort. This wiring effort may have a negative effect in terms of the heat losses arising during operation. In any case, the complex manufacturing steps entail high production costs.

It is desirable to provide a switching device of the abovementioned type that entails low wiring effort between the power module and the bypass unit by virtue of structural measures and at the same time is able to be provided with minimal outer dimensions.

SUMMARY

At least one embodiment of the application is directed to a switching device. Advantageous configurations become apparent from the claims.

What is proposed in at least one embodiment is a switching device for a single-phase or multiphase electrical consumer. The switching device comprises a number of line sections corresponding to the number of phases, wherein each line section comprises a first connection part, serving as input, for connection to a grid phase and a second connection part, serving as output, for connection to a connection phase of the electrical consumer. The switching device furthermore comprises a power module that comprises at least one controllable semiconductor switching element per phase, wherein the at least one controllable semiconductor switching element is wired between the first and the second connection part. The switching device furthermore comprises a bypass unit that comprises one controllable electromechanical switching element with a low on-resistance per phase. The controllable electromechanical switching element is in this case wired, in parallel with the at least one controllable semiconductor switching element of this phase, between the first and the second connection part.

BRIEF DESCRIPTION OF THE DRAWINGS

The invention is explained in more detail below with reference to an example embodiment in the drawing. In the figures.

DETAILED DESCRIPTION OF EXAMPLE EMBODIMENTS

Figure 1:
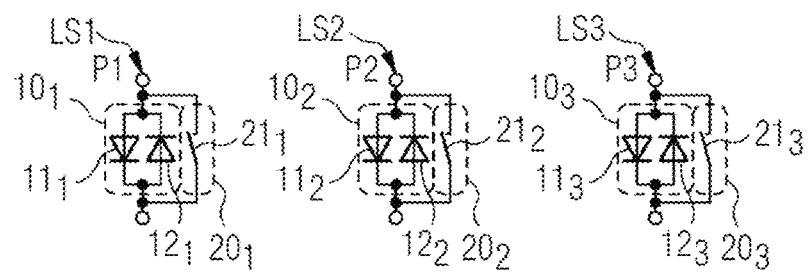
FIG. 1 shows an equivalent circuit diagram of a switching device for a single-phase or multiphase electrical consumer.

In the following, embodiments of the invention are described in detail with reference to the accompanying drawings. It is to be understood that the following description of the embodiments is given only for the purpose of illustration and is not to be taken in a limiting sense. It should be noted that the drawings are to be regarded as being schematic representations only, and elements in the drawings are not necessarily to scale with each other. Rather, the representation of the various elements is chosen such that their function and general purpose become apparent to a person skilled in the art.

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

Various example embodiments will now be described more fully with reference to the accompanying drawings in which only some example embodiments are shown. Specific structural and functional details disclosed herein are merely representative for purposes of describing example embodiments. Example embodiments, however, may be embodied in various different forms, and should not be construed as being limited to only the illustrated embodiments. Rather, the illustrated embodiments are provided as examples so that this disclosure will be thorough and complete, and will fully convey the concepts of this disclosure to those skilled in the art. Accordingly, known processes, elements, and techniques, may not be described with respect to some example embodiments. Unless otherwise noted, like reference characters denote like elements throughout the attached drawings and written description, and thus descriptions will not be repeated. The present invention, however, may be embodied in many alternate forms and should not be construed as limited to only the example embodiments set forth herein.

It will be understood that, although the terms first, second, etc. may be used herein to describe various elements, components, regions, layers, and/or sections, these elements, components, regions, layers, and/or sections, should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items. The phrase "at least one of" has the same meaning as "and/or".

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

Spatial and functional relationships between elements (for example, between modules) are described using various terms, including "connected," "engaged," "interfaced," and "coupled." Unless explicitly described as being "direct," when a relationship between first and second elements is described in the above disclosure, that relationship encompasses a direct relationship where no other intervening elements are present between the first and second elements, and also an indirect relationship where one or more intervening elements are present (either spatially or functionally) between the first and second elements. In contrast, when an element is referred to as being "directly" connected, engaged, interfaced, or coupled to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Also, the term "example" is intended to refer to an example or illustration.

When an element is referred to as being "on," "connected to," "coupled to," or "adjacent to," another element, the element may be directly on, connected to, coupled to, or adjacent to, the other element, or one or more other intervening elements may be present. In contrast, when an element is referred to as being "directly on," "directly connected to," "directly coupled to," or "immediately adjacent to," another element there are no intervening elements present.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Before discussing example embodiments in more detail, it is noted that some example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Specific structural and functional details disclosed herein are merely representative for purposes of describing example embodiments of the present invention. This invention may, however, be embodied in many alternate forms and should not be construed as limited to only the embodiments set forth herein.

What is proposed in at least one embodiment is a switching device for a single-phase or multiphase electrical consumer. The switching device comprises a number of line sections corresponding to the number of phases, wherein each line section comprises a first connection part, serving as input, for connection to a grid phase and a second connection part, serving as output, for connection to a connection phase of the electrical consumer. The switching device furthermore comprises a power module that comprises at least one controllable semiconductor switching element per phase, wherein the at least one controllable semiconductor switching element is wired between the first and the second connection part. The switching device furthermore comprises a bypass unit that comprises one controllable electromechanical switching element with a low on-resistance per phase. The controllable electromechanical switching element is in this case wired, in parallel with the at least one controllable semiconductor switching element of this phase, between the first and the second connection part.

The switching device is distinguished in that the first and the second connection part of a respective phase are arranged adjacently next to one another on one side of the power module in spatial proximity in a direction of extent. A contact bridge of the electromechanical switching element, assigned to a respective phase, of the bypass unit furthermore runs in the direction of extent in order to electrically connect the first and the second connection part in the switched-on state of the controllable electromechanical switching element.

The switching device according to at least one embodiment of the invention allows a compact and inexpensive structure since the first and the second connection part to which respective load terminals of the switching elements of the power module and of the bypass unit are connected are arranged on one side of the power module and in spatial proximity to one another. This makes it possible to connect the first and the second connection part of a phase, after reaching the nominal operating point, by way of a contact bridge that is part of the controllable electromechanical switching element of a phase of the bypass unit. The components of the power are module able to be switched on or switched off very easily by virtue of the contact bridge running in the direction of extent. This structure in particular makes it possible to minimize wiring effort between the components of the power module and of the bypass unit. One structural feature of this switching device is thus that the inputs and outputs of the switching device are located on one side of the apparatus, wherein external contact may however also be made with the grid phase and the connection phase on other, different sides of the switching device.

Current paths are able to be shortened by bypassing the first connection part, serving as input, and the second connection part, serving as output, by way of the contact bridge. This makes it possible to give the switching device a compact structure. A connection to the bypass unit may in particular be dispensed with.

Reducing the current paths and reducing the contact points furthermore has a positive effect on heat losses and therefore the robustness of the switching device.

One expedient configuration makes provision for the power module and the bypass unit to be arranged in a common housing. This facilitates handling of the switching device when it is installed at a usage location, since it is necessary only to attach the switching device for example to a busbar and to connect the grid phase and the connection phase to the corresponding lines. It is in this case not necessary to perform internal wiring operations. This configuration facilitates a compact structure.

A further configuration makes provision for the power module and the bypass unit of a respective phase to be arranged behind one another in an arrangement direction, wherein the arrangement direction runs transverse to the direction of extent. This allows a slim structure of the switching device, that is to say the switching device has a small width when it is attached in a conventional manner to a busbar. Due to the fact that the first and the second connection part are arranged on one side of the power module and are able to be routed out of the housing of the switching device, the space required in terms of height to create the connection to the grid phase and the connection phase is able to be kept low.

According to a further expedient configuration, the power module and the bypass unit of a respective phase are bounded laterally by partition walls running in the arrangement direction. This results firstly in insulation of the components belonging to a phase. Secondly, dissipation of heat may furthermore be simplified.

A further configuration makes provision for the first and the second connection part to be flat sections of connection rails whose ends comprise flat end sections for connection to connection elements of the grid phase or connection phase of the consumer. Due to the fact that the first and the second connection part are flat sections of connection rails, these may be particularly easily brought into electrical contact with contacts of the contact bridge in order to electrically connect the first and the second connection part in the switched-on state of the controllable electromechanical switching element of the bypass unit. A structurally simple connection is thereby thus able to be achieved, wherein the connection elements constitute part of the contact path of the bypass unit.

It is furthermore expedient if the switching device comprises one fan element per phase. A targeted airflow is able to be guided in the direction of those components of the power module and of the bypass unit that heat up during operation, in conjunction with the partition walls between the components of phases arranged next to one another. The heat arising in the components is thereby able to be dissipated through the air.

It is furthermore expedient if the fan element is mechanically attached to the connection rails belonging to a phase. The fan element may for example be affixed particularly easily to the connection rails or to an attachment part affixed thereto by way of a releasable plug connection. It is in particular not necessary to provide corresponding integral components on the housing or a housing part for the fan element.

It is furthermore expedient if the fan element and the bypass unit are arranged on opposing sides of the connection rails belonging to a phase. This allows a compact structure of the switching device.

A further expedient configuration makes provision for an airflow able to be generated by the fan element to impinge on a heat sink thermally conductively connected to the power module in the arrangement direction. Due to the fact that the heat sink lies directly in the arrangement direction of the airflow, the heat transferred to the heat sink may easily be dissipated.

Another configuration makes provision for the contact bridges of the electromechanical switching element, assigned to a respective phase, of the bypass unit of a multiphase switching device to be arranged in a common imaginary line of the direction of extent. The respective contact bridges, which are part of the electromechanical switching element assigned to a phase, thus lie next to one another in the direction of extent. The electromechanical switching elements of respective phases are elements that are separate from one another, that is to say they do not have any mechanical relationship or connection with one another.

It is furthermore expedient if a bypass unit of the electromechanical switching element assigned to a respective phase is designed to connect the contact bridges to the first and the second connection element, wherein the bypass unit is routed in an intermediate space between the first and the second connection part. This configuration allows a compact design of the electromechanical switching element of a respective phase. In addition to a simple and robust mechanical structure, it is furthermore possible to provide a compact switching element and thus a compact switching device.

The switching device in particular comprises a power module and a bypass unit for the connection of three-phase consumers. In one particularly expedient configuration, the switching device is a soft starter for a working machine in the form of an in particular permanently excited three-phase current machine.

In the figures described below, identical reference signs denote identical elements.

FIG. 1 shows a schematic illustration of an equivalent circuit diagram of a switching device for a three-phase electrical consumer. The switching device is described below with reference to a soft starter, but this should not be regarded as being restrictive. The electrical consumer is for example a working machine, in particular a permanently excited three-phase current machine. A switching module is arranged in a respective line section LS1, LS2, LS3 of each of the phases P1, P2, P3. Each switching module comprises a power module $10_1$, $10_2$ or $10_3$ and a bypass unit $20_1$, $20_2$ or $20_3$. The index "1", "2" or "3" following a reference sign in the figures in this case denotes the respective element of the phase P1, P2 or P3.

In a respective switching module, the power module $10_1$, $10_2$, $10_3$ comprises two antiparallel-wired controllable semiconductor switching elements $11_1$ and $12_1$, $11_2$ and $12_2$ and $11_3$ and $12_3$. One controllable electromechanical switching element $21_1$, $21_2$ or $21_3$ per phase is provided in parallel with the controllable semiconductor switching elements $11_1$ and $12_1$, $11_2$ and $12_2$ and $11_3$ and $12_3$, the switching element being part of the bypass unit $20_1$, $20_2$ or $20_3$. The bypass unit $20_1$, $20_2$ or $20_3$, which is also referred to as a bypass, generally comprises a contactor or a relay as a controllable electromechanical switching element. The bypass unit $20_1$, $20_2$ or $20_3$ serves, after the working machine is started by actuating the switching elements of the power module $10_1$, $10_2$, $10_3$, to keep the power losses of the switching module as low as possible at the nominal operating point of the working machine. For this purpose, the controllable electromechanical switching elements $21_1$, $21_2$ or $21_3$ of the bypass modules 20 are put into the on state after the nominal operating point of the working machine has been reached, as a result of which the controllable semiconductor switching elements $11_1$ and $12_1$, $11_2$ and $12_2$ and $11_3$ and $12_3$ of the power modules $10_1$, $10_2$, $10_3$ are bypassed. The structure, described in connection with FIG. 1, of the switching module, which has an identical structure in all three phases, corresponds to the basic electrical wiring of a soft starter.

Figure 2:
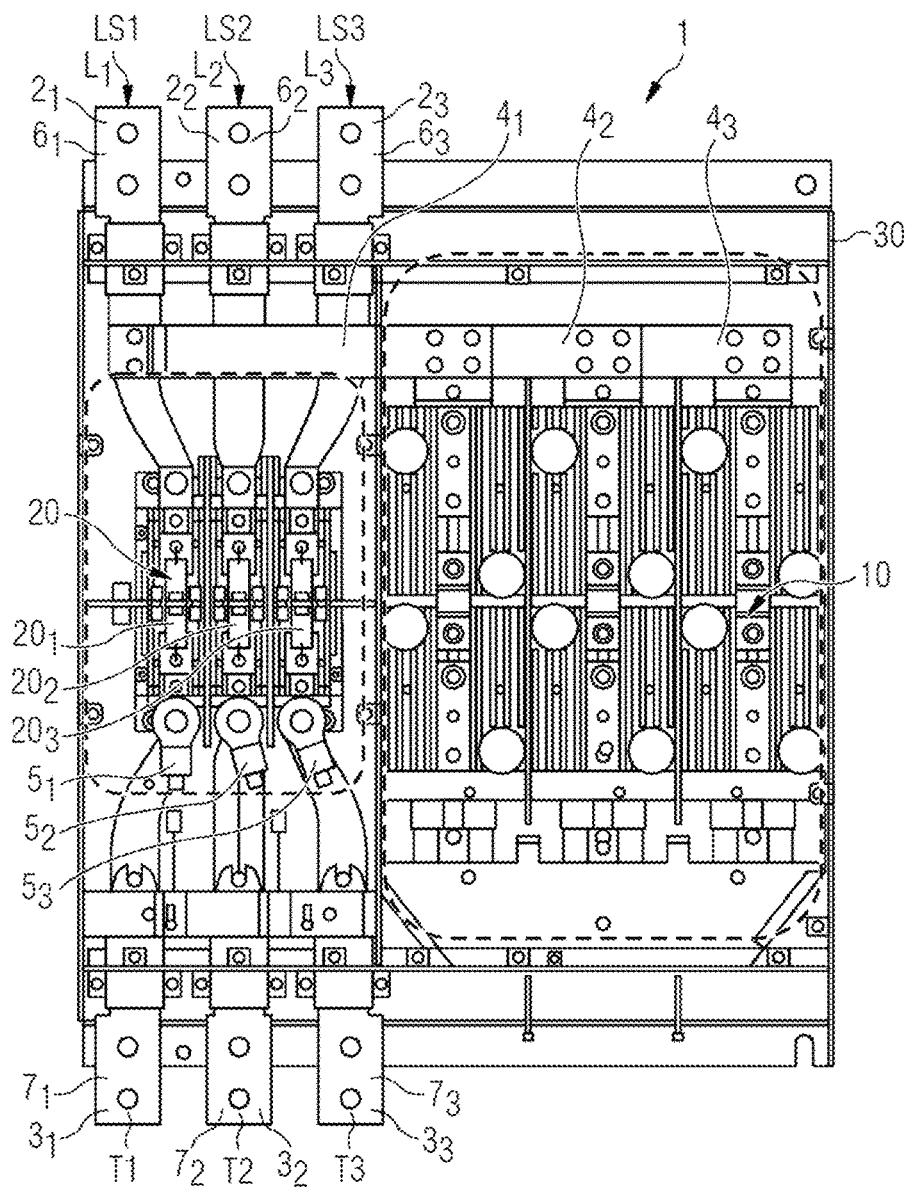
FIG. 2 shows a schematic illustration of a switching device known from the prior art in a plan view.

FIG. 2 shows a plan view of a soft starter known from the prior art as a switching device for a three-phase consumer.

The power module identified as a whole by the reference sign 10 in this case comprises the power modules $10_1$, $10_2$ and $10_3$ illustrated in FIG. 1 with the in each case two antiparallel-connected controllable semiconductor switching elements $11_1$ and $12_1$, $11_2$ and $12_2$ and $11_3$ and $12_3$ (not identified specifically). The power module 10, which combines all of the controllable semiconductor switching elements for the three phases P1, P2, P3 in the example structural form that is shown, may be provided in a standalone housing.

The switching device 1 furthermore comprises the bypass unit identified as a whole by the reference sign 20 and that comprises the bypass units $20_1$, $20_2$ and $20_3$, shown in the schematic illustration of FIG. 1, with the respective controllable electromechanical switching elements $21_1$, $21_2$ and $21_3$. The bypass unit 20 may be implemented in a standalone housing.

In the variant configuration illustrated in FIG. 2, the power module 10 and the bypass unit 20 are by way of example arranged next to one another in the width direction (that is to say from left to right in the plane of the drawing) in a common housing 30.

Connection rails $2_1$, $2_2$ and $2_3$ and $3_1$, $3_2$ and $3_3$ run toward the housing 30 and into the housing 30 above and below the bypass unit 20 (that is to say above and below in the plane of the drawing). A respective input-side connection rail $2_1$, $2_2$, $2_3$ and an output-side connection rail $3_1$, $3_2$, $3_3$ are in this case provided for each phase P1, P2, P3. There is a connection to a grid phase L1, L2 or L3 at end sections $6_1$, $6_2$, $6_3$ of the input-side connection rail $2_1$, $2_2$, $2_3$ (at the top in the plane of the drawing). There is an electrical connection to a connection phase T1, T2 and T3 of the electrical consumer, not shown here, that is to say the working machine, at end sections $7_1$, $7_2$, $7_3$ of the output-side connection rails $3_1$, $3_2$, $3_3$ (at the bottom in the plane of the drawing).

Connection rails $4_1$, $4_2$, $4_3$ and connection cables $5_1$, $5_2$, $5_3$ are provided in order to create the parallel connection of respective controllable electromechanical switching elements $21_1$, $21_2$, $21_3$ to the controllable semiconductor switching elements $11_1$ and $12_1$ of the phase P1, $11_2$ and $12_2$ of the phase P2 and $11_3$ and $12_3$ of the phase P3. The connection rails $4_1$, $4_2$, $4_3$ provided on the input side in this case lie above one another in the illustrated plan view, that is to say they do not have any electrical connection whatsoever between them. An insulating material may possibly be provided in the sections in which two connection rails are arranged above one another. The output-side connection rails $3_1$, $3_2$, $3_3$ are connected to one another by way of connection cables $5_1$, $5_2$, $5_3$ and respective terminal cable shoes in this example embodiment. It is clear to a person skilled in the art that this wiring is merely example, and only connection rails or connection cables could be used.

It is readily apparent that the use of the units power module 10 and bypass unit 20, present in separate form, and required wiring operations in order to form respective line sections LS1, LS2, LS3 for the three phases P1, P2, P3, entails a large amount of effort. This also results in an undesired non-compact structure in which in particular a large structural space is required in terms of width (that is to say from left to right in the plane of the drawing).

Figure 3:
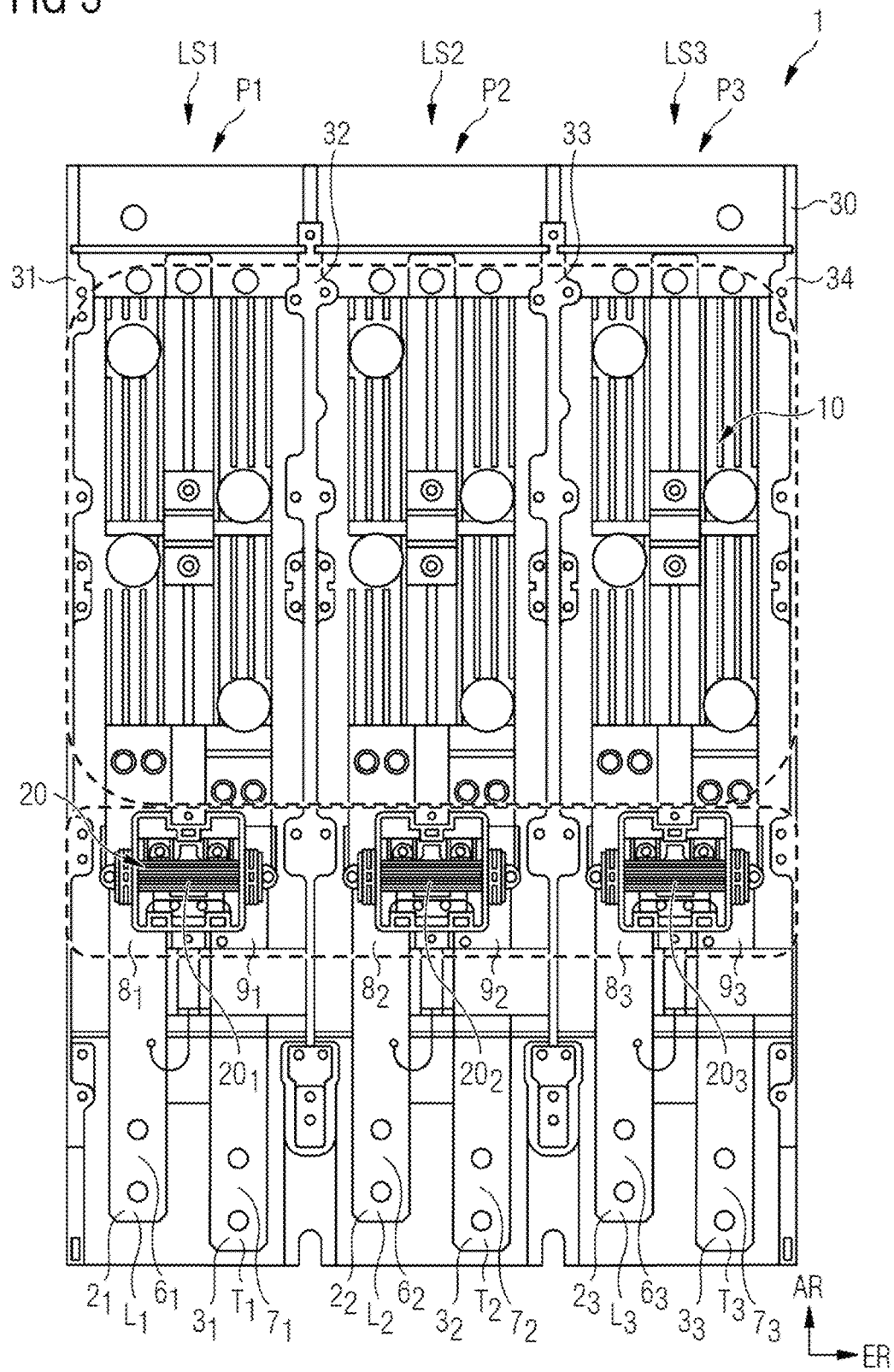
FIG. 3 shows a switching device according to the invention for a three-phase electrical consumer in a plan view.
Figure 4:
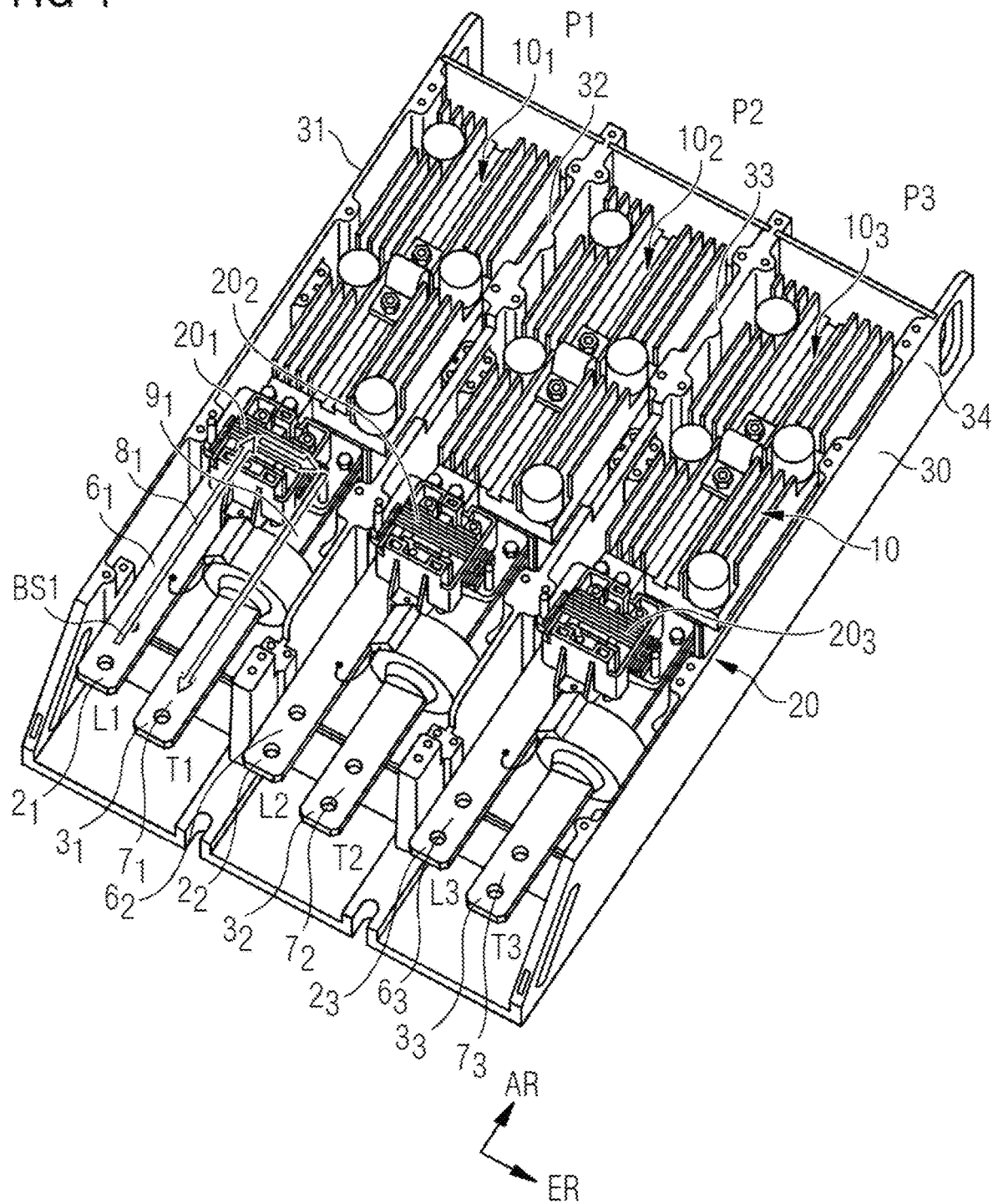
FIGS. 4 and 5 each show a perspective illustration of the switching device according to the invention shown in FIG. 3, illustrating the current paths occurring in two different operating states.
Figure 5:
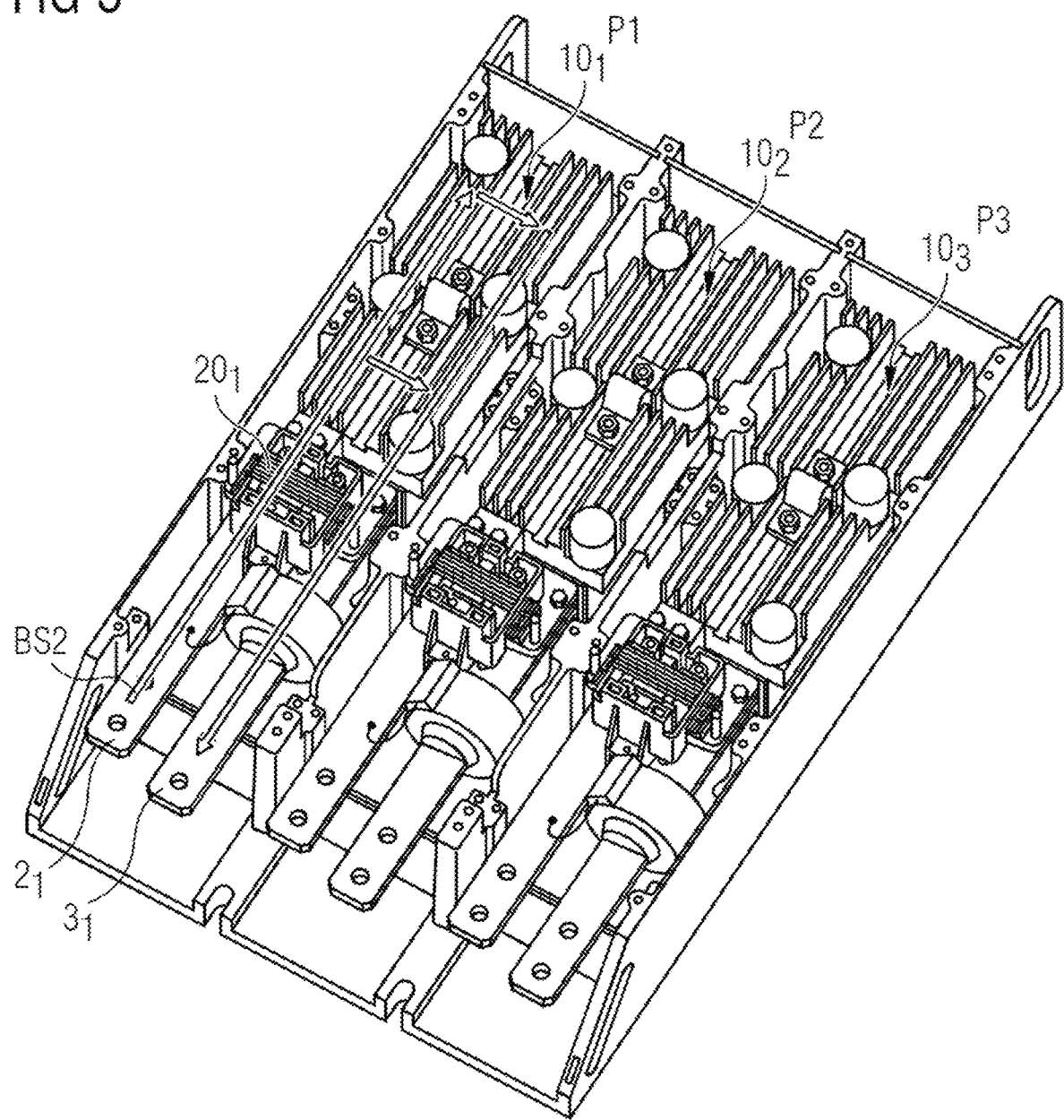

The switching device according to an embodiment of the invention illustrated below in FIGS. 3 to 5 is by contrast provided with greater compactness and less wiring effort. FIG. 3 in this case shows a plan view of a switching device 1 according to the invention with a power module 10 and a bypass unit 20 for a three-phase electrical consumer (not illustrated).

The technical structure of the power module 10 with its respective power modules $10_1$, $10_2$ and $10_3$ for the phases P1, P2 and P3 does not differ from the soft starter shown and described in FIG. 2. In contrast to the variant known from the prior art, however, the input-side and output-side connection rails $2_1$ and $3_1$ of the phase P1, $2_2$ and $3_2$ of the phase P2 and $2_3$ and $3_3$ of the phase P3 are arranged next to one another adjacently on one side of the power module 10, such that the connection rails $2_1$ and $3_1$ of the phase P1, the connection rails $2_2$ and $3_2$ of the phase P2 and the connection rails $2_3$ and $3_3$ of the phase P3 are arranged next to one another in a direction of extent ER. The direction of extent ER corresponds to the width direction and runs from left to right in the plane of the drawing. In the present example embodiment, the connection rails $2_1$, $3_1$, $2_2$, $3_2$, $2_3$, $3_3$ are arranged on the bottom of the switching device 1.

The connection rails $2_1$, $3_1$, $2_2$, $3_2$, $2_3$, $3_3$ in this case run transverse to the direction of extent ER in what is called an arrangement direction AR (from top to bottom in the plane of the drawing). Next to the power module 10, the connection rails $2_1$, $3_1$, $2_2$, $3_2$, $2_3$, $3_3$ have respective first and second connection parts $8_1$, $9_1$, $8_2$, $9_2$, $8_3$, $9_3$ in the form of flat sections of the connection rails. A respective contact bridge 25 (FIGS. 6 and 7) of the bypass units $20_1$, $20_2$ and $20_3$ of the electromechanical switching element assigned to a respective phase P1, P2, P3 in this case runs in the direction of extent ER in order to electrically connect the first and the second connection part $8_1$, $9_1$ of the phase P1 or $8_2$, $9_2$ of the phase P2 or $8_3$, $9_3$ of the phase P3 to one another in the switched-on state.

This means that the bypass units $20_1$, $20_2$, $20_3$, provided per phase, of the entire bypass unit 20 are arranged below the power module 10 in a plan view, such that the connection rails $2_1$, $3_1$, $2_2$, $3_2$, $2_3$, $3_3$ run downwardly in parallel in the arrangement direction AR, transverse to the direction of extent ER. As a result, the end sections $6_1$ and $7_1$ of the connection rails $2_1$, $3_1$, the end sections $6_2$ and $7_2$ of the connection rails $2_2$, $3_2$ and the end sections $6_3$ and $7_3$ of the connection rails $2_3$, $3_3$ come to lie adjacently next to one another. The fact that those ends of respective input-side connection rails $2_1$, $2_2$ and $2_3$ facing away from the power module 10 have a shorter length than those of the output-side connection rails $3_1$, $3_2$ and $3_3$ is merely one optional form of embodiment.

The power modules $10_1$, $10_2$, $10_3$ and the associated bypass units $20_1$, $20_2$, $20_3$ of a respective phase P1, P2, P3 are therefore arranged above one another in the arrangement direction AR, resulting in a small width. Since no space is required to connect the switching device 1 above the power module 10, for example in order to create an electrical connection, less space is required in comparison with the conventional switching device 1, including in the height direction.

The power module 10 and the bypass unit 20 in the example embodiment shown here are arranged in a common housing 30. The end sections $6_1$, $6_2$, $6_3$ and $7_1$, $7_2$, $7_3$ are also surrounded by this common housing 30, at least on one side.

Figure 9:
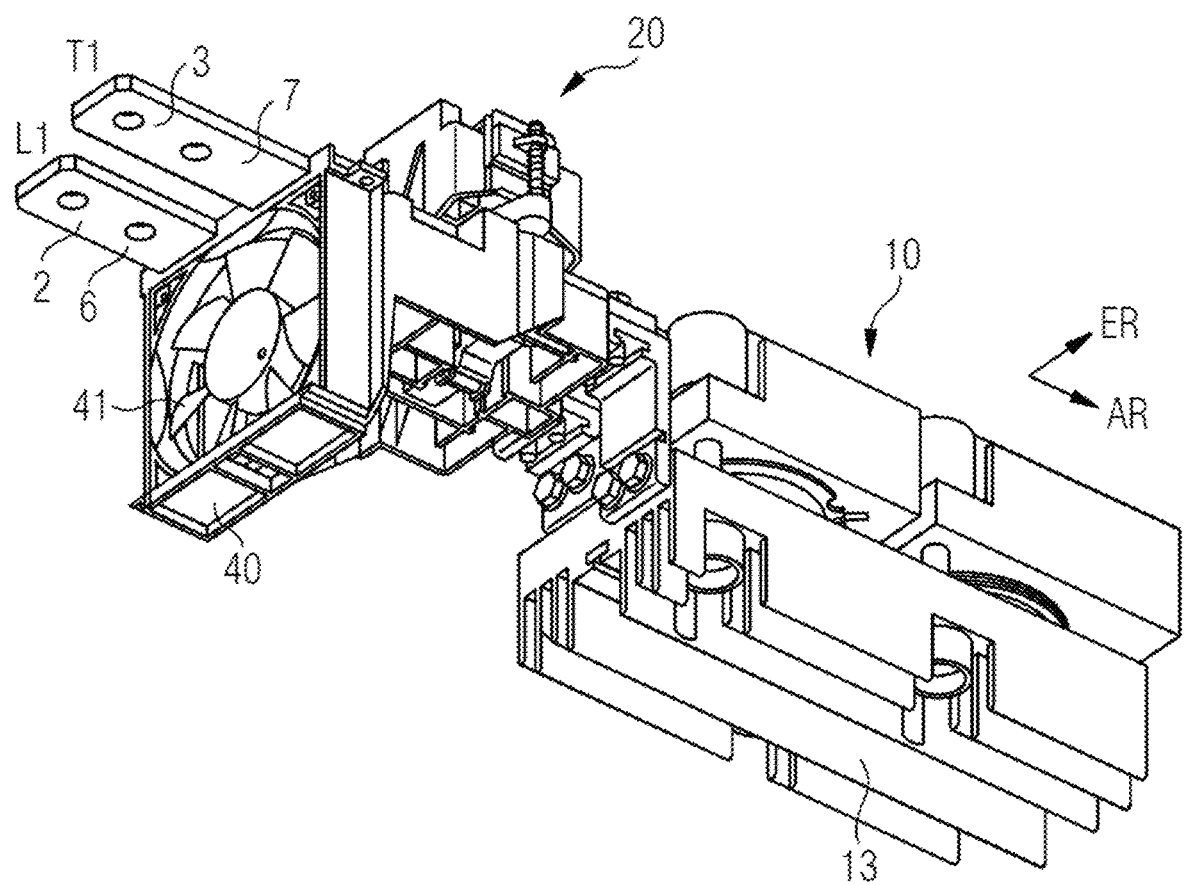
FIG. 9 shows a perspective illustration of a combination of power module and bypass unit with a fan element.

The power modules $10_1$, $10_2$, $10_3$ and the bypass units $20_1$, $20_2$, $20_3$ of a respective phase P1, P2, P3 are bounded laterally by partition walls 31, 32, 33, 34 running in the arrangement direction AR. Electrical insulation between the components of different phases is thereby ensured. At the same time, the electrical components are easily able to be cooled, as illustrated in FIG. 9 in the perspective illustration of the components of a phase. One fan element 40 is in principle provided per phase P1, P2, P3, wherein the fan element is mechanically attached to the connection rails 2, 3 belonging to the phase in question in FIG. 9. The fan element 40 and the bypass unit 20 are in this case arranged on opposing sides of the connection rail 2, 3 belonging to the phase. As a result, a heat sink 13 arranged underneath the power module 10 and that lies in the arrangement direction in an airflow generated by the fan element 40 is in particular able to be cooled well. Effective dissipation of the heat generated by the controllable semiconductor switching elements of the power module 10 is thereby in particular possible.

FIGS. 4 and 5 show perspective illustrations of the switching device (soft starter) shown in FIG. 3 from above. FIG. 4 in this case shows the current profile shown through the bypass module $20_1$ after reaching the nominal operating point of the working machine connected to the switching device for the phase P1 with BS1. The current flows through the input-side connection rail $2_1$, the closed switching bridge that electrically connects the first connection part $8_1$ to the second connection part $9_1$ of the output-side rail 3 and the connection rail $3_1$ back in the direction of the end section $7_1$.

FIG. 5 shows the current flow during the starting of the working machine for the phase P1, the current flow being identified by BS2. In this case, the contact bridge is not connected to the first and the second connection part $8_1$ of the connection rail $2_1$ and $9_1$ of the connection rail $3_1$, for which reason the current flows through the power module $10_1$ arranged in the arrangement direction AR and back through the output-side connection rail $3_1$. In the operating situation shown in FIG. 5, the controllable electromechanical switching element $21_1$ of the bypass unit $20_1$ is thus open.

Figure 6:
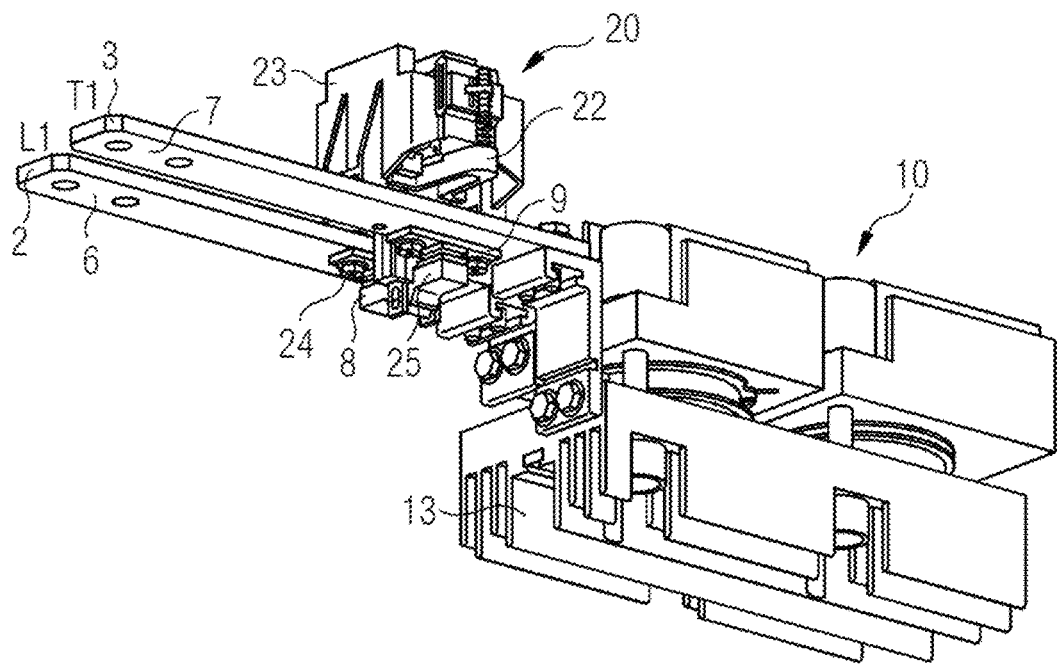
FIG. 6 shows a perspective illustration of a combination according to the invention of a power module and of a bypass unit for a phase.

FIG. 6 shows a perspective illustration of part of the switching device 1 for a phase. Since the structure is identical for the three phases P1, P2, P3, the respective indices of the reference signs are omitted in FIGS. 6, 7 and 8.

Figure 7:
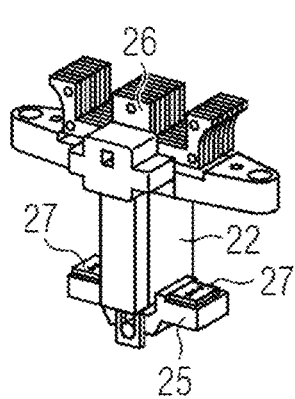
FIG. 7 shows a schematic illustration of part of a transformer unit.

As mentioned, the heat sink 13, for example made from a metal, in particular aluminum, is arranged underneath the power module 10. The power module 10 and the heat sink 13 are connected so as to have good thermal conduction, for example through a screw connection. It is readily apparent that the input-side connection rail 2 and the output-side connection rail 3 are guided from one side toward the power module 10. The bypass module 20, parts of which are illustrated in FIGS. 7 and 8, is arranged adjacent to the power module 10, on the top of the connection rail 2, 3.

Figure 8:
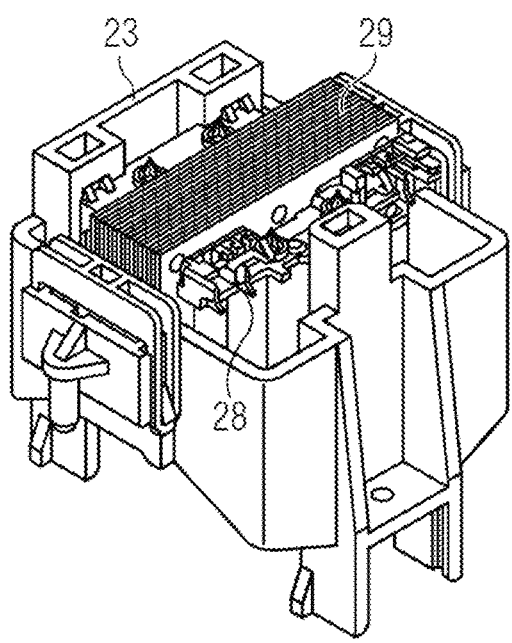
FIG. 8 shows a component of a bypass unit according to the invention in a perspective illustration.

FIG. 8 in this case shows the coil holder 23 arranged on the top of the connection rails 2 and 3, a magnetic coil 28 and a yoke 29 that are received in the coil holder 23. A contact carrier 22 (FIG. 7) as transformer unit, received in the coil holder 23, is fed through in an intermediate space formed between the connection rails 2 and 3, at the lower end of which contact carrier the contact bridge 25 is provided with contacts 27 arranged at opposing ends. The contacts 27 in this case come into contact, as described above, with the first connection part 8 of the connection rail 2 and the second connection part 9 of the connection rail 3 when the bypass unit 20 is switched on by way of a corresponding actuation signal. The reference sign 26 denotes an armature, wherein a spring clip and a contact spring are arranged inside the downwardly running contact carrier 22 in a manner known to a person skilled in the art in order to allow the contact bridge to move up and down and thus toward or away from the connection rails 2, 3.

Upon corresponding actuation by a controller, not shown in the figures, a current flows through the magnetic coil 28, as a result of which the armature 26 is moved upward. Due to the mechanical coupling, the contact bridge 25 is pressed, with the contacts 27 upward, against the connection rails 2, 3. As soon as the current through the magnetic coil 28 is switched off, the spring running inside the contact carrier ensures that the contacts 27 of the contact bridge 25 are pressed away from the connection parts 8, 9 of the connection rails 2, 3.

The contact carrier 22 thus serves to fasten the contact bridge 25 of the contact spring of the spring clip of the armature and the like. The coil holder 23 is required to keep the magnetic coil 28 in position around the yoke 29. By virtue of this compact structure, heat losses arising due to the electrical resistances of the connection rails and contact transitions may be reduced.

As a result, it is possible to construct a switching device designed as a soft starter in an extremely compact manner. A connection to a bypass unit may be dispensed with. Reducing the current paths and reducing the contact points have a positive effect on heat losses and the robustness of the apparatus.

By incorporating the bypass components into the ventilation section of the power modules, it is possible to dispense with additional cooling of the bypass contacts by way of forced ventilation. This also has a positive influence on the manufacturing costs of the switching device.

The patent claims of the application are formulation proposals without prejudice for obtaining more extensive patent protection. The applicant reserves the right to claim even further combinations of features previously disclosed only in the description and/or drawings.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

None of the elements recited in the claims are intended to be a means-plus-function element within the meaning of 35 U.S.C. § 112(f) unless an element is expressly recited using the phrase "means for" or, in the case of a method claim, using the phrases "operation for" or "step for."

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A switching device for a single-phase or multiphase electrical consumer, comprising
   a number of line sections corresponding to a number of phases, each line section of the number of line sections, including a first connection part, serving as input, for connection to a grid phase and a second connection part, serving as output, for connection to a connection phase of the single-phase or multiphase electrical consumer;
   a power module including at least one controllable semiconductor switching element for each phase of the number of phases, the at least one controllable semiconductor switching element being wired between the first connection part and the second connection part;
   a plurality of bypass units, each bypass unit of the plurality of bypass units including at least one controllable electromechanical switching element, with a low on-resistance, for each phase of the number of phases, the at least one controllable electromechanical switching element being wired, in parallel with at least one corresponding controllable semiconductor switching element of a corresponding phase of the number of phases, between the first connection part and the second connection part, the first connection part and the second connection part, of a respective phase of the number of phases, being arranged adjacently next to one another on one side of the power module in spatial proximity in a direction of extent; and
   a contact bridge of the at least one controllable electromechanical switching element, assigned to a respective phase of the number of phases of the bypass unit, being configured to run in the direction of extent in order to electrically connect the first connection part and the second connection part in a switched-on state.

2. The switching device of claim 1, wherein the power module and the bypass unit of a respective phase are arranged in a common housing.

3. The switching device of claim 2, wherein the power module and the bypass unit of a respective phase, of the number of phases, are arranged behind one another in an arrangement direction running transverse to the direction of extent.

4. The switching device of claim 3, wherein the power module and the bypass unit of a respective phase, of the number of phases, are bounded laterally by partition walls running in the arrangement direction.

5. The switching device of claim 1, wherein the power module and the bypass unit of a respective phase, of the number of phases, are arranged behind one another in an arrangement direction running transverse to the direction of extent.

6. The switching device of claim 5, wherein the power module and the bypass unit of a respective phase, of the number of phases, are bounded laterally by partition walls running in the arrangement direction.

7. The switching device of claim 1, wherein the first connection part and the second connection part are flat sections of connection rails whose ends include flat end sections for connection to connection elements of a grid phase or a connection phase of the consumer.

8. The switching device of claim 1, further comprising:
a plurality of fan elements, including a fan element for each phase of the number of phases.

9. The switching device of claim 8, wherein each respective fan element, of the plurality of fan elements, is mechanically attached to connection rails belonging to a respective phase of the number of phases.

10. The switching device of claim 9, wherein each respective fan element and each respective bypass unit are arranged on opposing sides of connection rails belonging to the respective phase.

11. The switching device of claim 8, wherein each respective fan element and each respective bypass unit are arranged on opposing sides of connection rails belonging to the respective phase.

12. The switching device of claim 8, wherein an airflow, generatable by the plurality of fan elements, is configured to impinge on a heat sink thermally conductively connected to the power module in the arrangement direction.

13. The switching device of claim 1, wherein the contact bridges of the electromechanical switching element, assigned to a respective phase of a bypass unit of a multi-phase switching device, are arranged in a common imaginary line of the direction of extent.

14. The switching device of claim 1, wherein a transformer unit of the electromechanical switching element, assigned to a respective phase, is designed to connect the contact bridge to the first connection part and the second connection part, wherein the transformer unit is routed in an intermediate space between the first connection part and the second connection part.

15. The switching device of claim 1, further comprising a power module and a bypass unit, to switch three phases of the number of phases.

16. The switching device of claim 1, wherein the switching device is a soft starter for a permanently excited three-phase current machine.

* * * * *